United States Patent
Oh et al.

(10) Patent No.: US 7,098,514 B2
(45) Date of Patent: Aug. 29, 2006

(54) HIGHLY INTEGRATED SEMICONDUCTOR DEVICE WITH SILICIDE LAYER THAT SECURES CONTACT MARGIN AND METHOD OF MANUFACTURING THE SAME

(75) Inventors: Myoung-hwan Oh, Yongin-si (KR); Young-gun Ko, Seongnam-si (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/862,996

(22) Filed: Jun. 8, 2004

(65) Prior Publication Data
US 2005/0040472 A1    Feb. 24, 2005

(30) Foreign Application Priority Data
Aug. 22, 2003   (KR)   ............... 10-2003-0058287

(51) Int. Cl.
*H01L 29/76*   (2006.01)
*H01L 29/94*   (2006.01)
*H01L 31/62*   (2006.01)
*H01L 31/113*  (2006.01)
*H01L 31/119*  (2006.01)

(52) U.S. Cl. ............... 257/384; 257/388; 257/412; 257/413

(58) Field of Classification Search ........ 257/382–384, 257/388, 412–413, 330–334, 345
See application file for complete search history.

(56) References Cited

U.S. PATENT DOCUMENTS 6,255,703 B1   7/2001   Hause et al. ............... 257/384
6,902,980 B1 *  6/2005   Wang et al. ............... 438/305

FOREIGN PATENT DOCUMENTS

KR   10-0361533   11/2002

* cited by examiner

*Primary Examiner*—Thien F. Tran
(74) *Attorney, Agent, or Firm*—Mills & Onello LLP

(57) ABSTRACT

Provided are a highly integrated semiconductor device with a silicide layer, which can secure a contact margin, and a method of manufacturing the highly integrated semiconductor device. The highly integrated semiconductor device includes a gate electrode formed on a semiconductor substrate. A source region and a drain region are formed in predetermined upper portions of the semiconductor substrate on two sides of the gate electrode such that each of the source region and the drain region includes a lightly doped drain (LDD) region and a heavily doped region. A suicide layer is formed on the gate electrode, the source region, and the drain region. The silicide layer has a sufficient thickness to function as an ohmic contact and is formed on the LDD region and the heavily doped region of each of the source region and the drain region.

10 Claims, 6 Drawing Sheets

HIGHLY INTEGRATED SEMICONDUCTOR DEVICE WITH SILICIDE LAYER THAT SECURES CONTACT MARGIN AND METHOD OF MANUFACTURING THE SAME

BACKGROUND OF THE INVENTION

This application claims the priority of Korean Patent Application No. 2003-58287, filed on Aug. 22, 2003, in the Korean Intellectual Property Office, the disclosure of which is incorporated herein in its entirety by reference.

1. Field of the Invention

The present invention relates to a highly integrated semiconductor device and a method of manufacturing the highly integrated semiconductor device, and more particularly, to a highly integrated semiconductor device with a silicide layer that can secure a contact margin, and a method of manufacturing the highly integrated semiconductor device.

2. Description of the Related Art

As the degree of integration of a semiconductor device increases, the area and line width of the semiconductor device decreases, resulting in an increase of an interconnection resistance and a contact resistance of the semiconductor device.

Such an increase in resistance reduces the operating speed of the semiconductor device.

To reduce the interconnection resistance and contact resistance, a method of forming a self-aligned silicide (SALICIDE) layer on a gate electrode, a source region, and a drain region of a metal oxide semiconductor (MOS) transistor has been suggested in *Silicon processing for the VLSI Era* (Vol. 4, page 604).

A conventional highly integrated semiconductor device comprising a self-aligned silicide layer will be described with reference to FIGS. 1 and 2.

Figure 1:
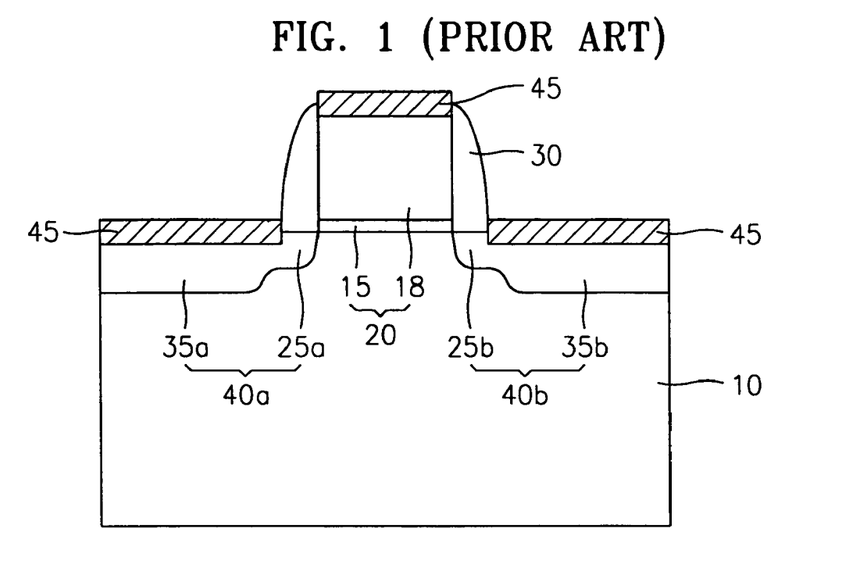
FIGS. 1 and 2 are cross-sectional views of a conventional highly integrated semiconductor device.

Referring to FIG. 1, a gate insulating layer 15 and a polysilicon layer 18 are sequentially deposited on a semiconductor substrate 10, for example, a silicon substrate, and predetermined portions of the gate insulating layer 15 and the polysilicon layer 18 are patterned to form a gate electrode 20. Low concentration impurity ions are implanted into predetermined portions of the semiconductor substrate 10 on both sides of the gate electrode 20 to form lightly doped drain (LDD) regions 25a and 25b. Next, an insulating spacer 30 is formed along both sidewalls of the gate electrode 20, and heavily doped regions 35a and 35b are formed in predetermined portions of the semiconductor substrate 10 on both sides of the spacer 30, thereby forming a source region 40a and a drain region 40b. Next, a transition metal layer (not shown) is deposited on the resultant structure, and a heat treatment is performed. The gate electrode 20, the source region 40a, and the drain region 40b, which are made of silicon, react with the transition metal layer, such that a silicide layer 45 is formed on the gate electrode 20, the source region 40a, and the drain region 40b. Next, unreacted portions of the transition metal layer are removed. Since the silicide layer 45, which has a low resistance, is formed on the gate electrode 20, the source region 40a, and the drain region 40b, which are to be connected to a metal layer later, an interconnection resistance and a contact resistance are reduced.

Figure 2:
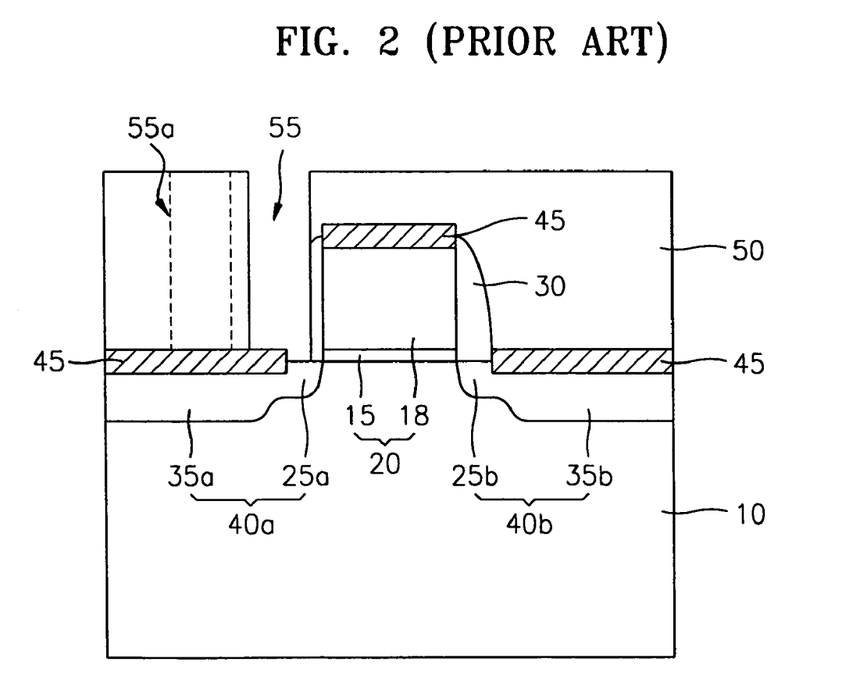

Referring to FIG. 2, an interlayer insulating layer 50 is deposited on the resultant structure of FIG. 1, and is etched until the source region 40a and the drain region 40b are exposed, thereby forming a contact hole 55a.

However, as the degree of integration of the semiconductor device increases, the areas of the source region 40a and the drain region 40b decrease. Because of a lack of a margin necessary for the contact hole, misalignment may occur during a photolithography process performed to form the contact hole. If misalignment occurs, a contact hole 55 passing through the spacer 30 may be formed, thereby exposing the LDD region 25a, as shown in FIG. 2. Since the LDD region 25a exposed by the contact hole 55 has a relatively low impurity concentration and a high resistance, a contact resistance between the LDD region 25a and the metal layer (not shown) increases when the LDD region 25a contacts the metal layer later.

Furthermore, with the reduced line width of the gate electrode in the highly integrated semiconductor device, the depths of the source region 40a and the drain region 40b are also decreasing. As a consequence, a design rule of less than 0.1 μm requires a junction depth less than approximately 800 Å.

If the silicide layer 45 is formed on the source region 40a and the drain region 40b having a shallow junction depth, the silicide layer must also be thin, and the silicon of which the source region 40a and the drain region 40b are made is mostly used to form the silicide layer 45, causing a junction leakage current.

SUMMARY OF THE INVENTION

The present invention provides a highly integrated semiconductor device comprising: a semiconductor substrate; a gate electrode disposed on a predetermined portion of the semiconductor substrate; an epitaxial layer formed on predetermined portions of the semiconductor substrate on both sides of the gate electrode such that the gate electrode is recessed a predetermined depth into the epitaxial layer; a source region and a drain region formed in the epitaxial layer and predetermined upper portions of the semiconductor substrate below the epitaxial layer such that each of the source region and the drain region includes a lightly doped drain region and a heavily doped region; an offset spacer formed along the sidewalls of the gate electrode and insulating the gate electrode from the source region and the drain region; and a silicide layer formed on the gate electrode, the source region, and the drain region, wherein the silicide layer is formed on the lightly doped drain region and the heavily doped region of each of the source region and the drain region.

In one embodiment, the silicide layer has a sufficient thickness to function as an ohmic contact layer.

The epitaxial layer can be a silicon layer or a silicon-germanium layer. The epitaxial layer can have a thickness ranging approximately from 250 to 350 Å. Each of the source region and the drain region can have a depth ranging from 800 to 1000 Å.

The offset spacer can have a minimum thickness necessary to insulate conductive layers from each other. The offset spacer can have a thickness ranging from 150 to 250 Å.

In one embodiment, the silicide layer is thinner than the epitaxial layer.

The silicide layer can be composed of a metal selected from the group consisting of titanium, cobalt, nickel, platinum, and a combination of these metals.

In one embodiment, the semiconductor substrate is a silicon-on-insulator substrate.

The highly integrated semiconductor device can further include a self-aligned spacer, which is formed along sidewalls of the offset spacer. According to another aspect of the present invention, there is provided a highly integrated semiconductor device comprising: a semiconductor substrate; a gate electrode disposed on the semiconductor substrate; an epitaxial layer disposed on predetermined portions of the semiconductor substrate on both sides of the gate electrode such that the gate electrode is recessed a predetermined depth into the epitaxial layer; a source region and a drain region formed in the epitaxial layer and predetermined upper portions below the epitaxial layer such that each of the source region and the drain region includes a lightly doped drain region and a heavily doped region; an offset spacer formed along the sidewalls of the gate electrode and insulating the gate electrode from the source region and the drain region; an insulating spacer formed along both sides of the offset spacer; and a silicide layer formed on the gate electrode, the source region, and the drain region, wherein a portion of the silicide layer formed on the heavily doped region is thicker than a portion of the silicide layer formed on the lightly doped drain region. According to still another aspect of the present invention, there is provided a method of manufacturing a highly integrated semiconductor device, the method comprising: forming a gate electrode on a semiconductor substrate; forming an offset spacer along sidewalls of the gate electrode; growing predetermined portions of the semiconductor substrate on two sides of the gate electrode to a predetermined thickness to form a selective epitaxial growth layer; forming a source region and a drain region in the predetermined grown portions of the semiconductor substrate on the two sides of the gate electrode such that each of the source region and the drain region includes a lightly doped drain region and a heavily doped region; and forming a silicide layer on the gate electrode, the source region, and the drain region, wherein the silicide layer is formed on each of the lightly doped drain region and the heavily doped region.

In one embodiment, the offset spacer has a minimum thickness necessary to insulate conductive layers from each other. Forming of the offset spacer can include: reoxidizing the gate electrode and the semiconductor substrate; depositing an insulating layer on the resultant structure to a predetermined thickness; and anisotropically etching the insulating layer.

In one embodiment, the forming of the source region and the drain region includes: implanting low concentration impurities into the predetermined portions of the semiconductor substrate on the both sides of the gate electrode to form the lightly doped drain regions; forming a lightly doped drain spacer along sidewalls of the gate electrode; implanting high concentration impurities into predetermined portions of the semiconductor substrate to form the heavily doped regions such that the lightly doped drain space is disposed between the heavily doped regions and the gate electrode; and removing the lightly doped drain spacer.

In one embodiment, forming of the source region and the drain region and the forming of the silicide layer include: implanting low concentration impurities into the predetermined portions of the semiconductor substrate on the two sides of the gate electrode to form the lightly doped drain regions; forming the silicide layer on the lightly doped drain regions; forming an insulating spacer along sidewalls of the gate electrode; and implanting high concentration impurities into predetermined portions of the semiconductor to form the heavily doped regions such that the insulating spacer is disposed between the heavily doped regions and the semiconductor substrate. Forming of the silicide layer can include: depositing a transition metal layer on the resultant structure of the semiconductor substrate having the source region and the drain region formed therein, and the gate electrode; thermally processing the transition metal layer to form the silicide layer; and removing remaining portions of the transition metal layer. The transition metal layer can be made of a metal selected from the group consisting of titanium, cobalt, nickel, platinum, and a combination of these metals. In one embodiment, if the transition metal layer is made of a metal selected from titanium and cobalt, the thermally processing step includes: first thermally processing the transition metal layer at a temperature of 350 to 600° C.; and second thermally processing the first thermally processed transition metal layer at a temperature of 500 to 900° C. If the transition metal layer is made of nickel, the thermally processing step can include thermally processing the transition metal layer at a temperature of 350 to 600° C.

The method can further include forming a self-aligned spacer along sidewalls of the offset spacer, after the forming of the silicide layer.

According to yet another aspect of the present invention, there is provided a method of manufacturing a highly integrated semiconductor device, the method comprising: forming a gate electrode on a semiconductor substrate; forming an offset spacer along sidewalls of the gate electrode with a minimum thickness necessary to insulate conductive layers from each other; growing predetermined portions of the semiconductor substrate on two sides of the gate electrode to a predetermined thickness to form a selective epitaxial growth layer; forming a source region and a drain region in the predetermined grown portions of the semiconductor substrate on the two sides of the gate electrode such that each of the source region and the drain region includes a lightly doped drain region and a heavily doped region; forming a first silicide layer on the gate electrode, the source region, and the drain region; forming an insulating spacer along two sides of the offset spacer; and forming a second silicide layer on predetermined portions of the first silicide layer on the two sides of the offset spacer and on the gate electrode.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention will now be described more fully with reference to the accompanying drawings, in which preferred embodiments of the invention are shown. The sizes of elements in the drawings are exaggerated to provide visual clarity and permit clear description.

Figure 3:
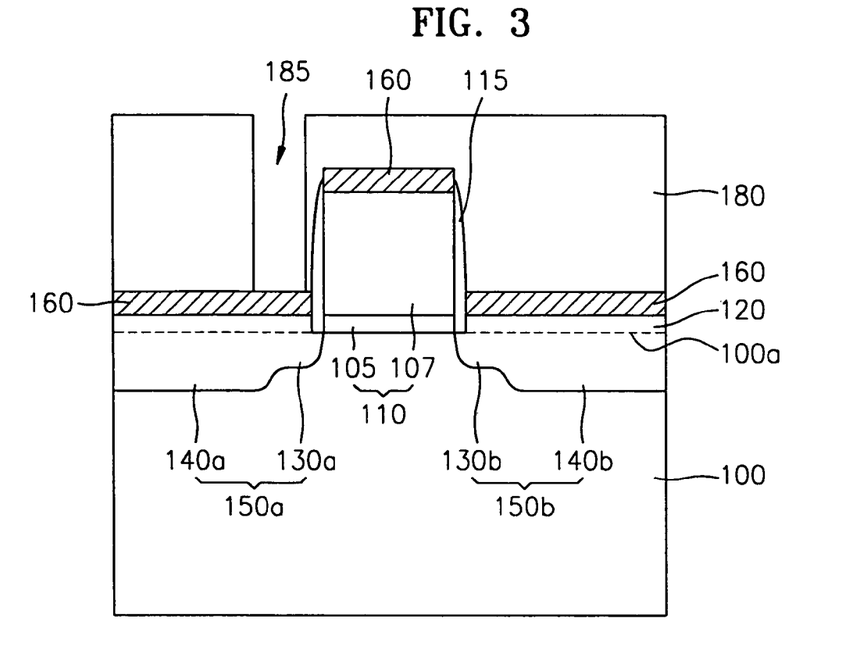
FIG. 3 is a cross-sectional view of a highly integrated semiconductor device according to a first preferred embodiment of the present invention.

FIG. 3 is a cross-sectional view of a highly integrated semiconductor device according to a first embodiment of the present invention, and FIGS. 4A through 4D are cross-sectional views illustrating a method of manufacturing the highly integrated semiconductor device of FIG. 3.

Referring to FIG. 3, a gate electrode 110 is formed on a semiconductor substrate 100. The semiconductor substrate 100 may be, for example, a silicon substrate or a silicon-germanium substrate. The gate electrode 110 includes a gate insulating layer 105 and a polysilicon layer 107. The gate electrode 110 is recessed a predetermined thickness into the semiconductor substrate 100. That is, the surface of the semiconductor substrate 100 on both sides of the gate electrode 110 is elevated to a predetermined thickness so as to overlap the sidewalls of the gate electrode 110. Predetermined portions of the semiconductor substrate 100 that partially overlap the sidewalls of the gate electrode 110 may be a selective epitaxial growth (SEG) layer 120 made of silicon or silicon-germanium. The thickness d of the predetermined portions of the semiconductor substrate 100, namely, the SEG layer, ranges from 100 to 1000 Å, and preferably, from 250 to 350 Å. A thin offset spacer 115 is formed along the sidewalls of the gate electrode 110. The offset spacer 115 is interposed between the gate electrode 110 and the predetermined portions of the semiconductor substrate 100 to insulate the gate electrode 110 from the predetermined portions of the semiconductor substrate 100. The offset spacer 115 may be a silicon oxide (SiO2) layer, a silicon nitride (SiN) layer, a silicon oxynitride (SiON) layer, or a combination of the silicon oxide layer, the silicon nitride layer and the silicon oxynitride layer. It is preferable that the offset spacer 115 have a minimum thickness necessary to insulate the gate electrode 110 from the predetermined portions of the semiconductor substrate 100. In one embodiment, the minimum thickness ranges from 150 to 250 Å. The silicon oxide layer used as the offset spacer 115 may have a thickness in the range of 50 to 100 Å, and the silicon nitride layer used as the offset spacer 115 may have a thickness in the range of 100 to 150 Å.

A source region 150a and a drain region 150b are formed in predetermined upper portions of the semiconductor substrate 100 and include the SEG layer 120. The source region 150a includes a lightly doped drain (LDD) region 130a and a heavily doped region 140a, and the drain region 150b includes an LDD region 130b and a heavily doped region 140b. The source region 150a and the drain region 150b are formed in the SEG layer 120 and in the predetermined upper portions of the semiconductor substrate 100 under the SEG layer 120. The source region 150a and the drain region 150b have a shallow junction depth below an initial surface 100a of the semiconductor substrate 100 but have a sufficient junction depth by virtue of the SEG layer 120. The junction depth of the source region 150a and the drain region 150b ranges approximately from 800 to 1000 Å.

A silicide layer 160 having a predetermined thickness is formed on the gate electrode 110, the source region 150a, and the drain region 150b. It is preferable that the silicide layer 160 have a sufficient thickness to function as an ohmic contact layer without being lost during a contact with conductive interconnection lines later. For example, the sufficient thickness may be in the range of 100 to 1000 Å. Since the LDD regions 130a and 130b are not covered by the offset spacer 115, the silicide layer 160 having the thickness suitable for the ohmic contact function is also uniformly formed on the LDD regions 130a and 130b.

An interlayer insulating layer 180 is formed on the resultant structure of the semiconductor substrate 100 having the silicide layer 160 formed thereon. A contact hole 185 is formed in the interlayer insulating layer 180 to expose the source region 150a and/or the drain region 150b. The conductive interconnection lines (not shown) are formed in the contact hole 180. Even if the LDD regions 130a and 130b are exposed due to misalignment during the formation of the contact hole 185, contact resistance does not greatly increase since the silicide layer 160, which has a low resistance, is formed on the LDD regions 130a and 130b, which have high resistances because of forming the silicide layer 160 on the LDD regions 130a and 130b. Accordingly, the contact hole 185 can be formed over the entire area of the LDD regions 130a and 130b, thereby increasing a contact margin.

A method of manufacturing the highly integrated semiconductor device will now be described.

Figure 4A:
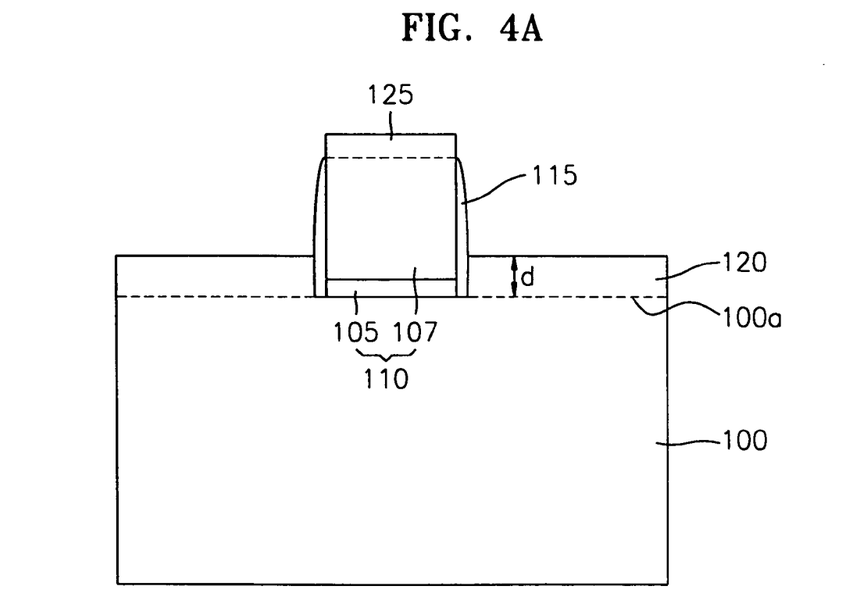
FIGS. 4A through 4D are cross-sectional views illustrating a method of manufacturing the highly integrated semiconductor device of FIG. 3.

Referring to FIG. 4A, the semiconductor substrate 100 is prepared. The semiconductor substrate 100 may be, for example, a silicon substrate or a silicon-germanium substrate that is doped with impurities. The gate insulating layer 105 and the polysilicon layer 107 are sequentially deposited on the semiconductor substrate 100, and are anisotropically etched to form the gate electrode 110. To repair damage that may occur during the etching process for forming the gate electrode 110, surfaces of the semiconductor substrate 100 and the gate electrode 110 are reoxidized. A reoxidized layer (not shown) may be formed on the surfaces of the semiconductor substrate 100 and the gate electrode 110 during the reoxidization. An insulating layer thinner than a general LDD spacer, for example, a silicon oxide layer, a silicon nitride layer, or a silicon oxynitride layer, is deposited on the resultant structure and acts as a spacer. It is preferable that the insulating layer have a minimum thickness, e.g., 100 to 200 Å, necessary to insulate conductive layers from each other. Next, the insulting layer is anisotropically blanket-etched to form the offset spacer 115 along the sidewalls of the gate electrode 110. The offset spacer 115 may include the reoxidized layer and the insulating layer. The reoxidized layer on the gate electrode 110 and the semiconductor substrate 100 is removed during the etching process for forming the offset spacer 115.

Next, the resultant structure is subjected to selective eptaxial growth to a predetermined thickness to form SEG layers 120 and 125. Since the SEG layers 120 and 125 are grown only on layers containing silicon, they are grown only on the semiconductor substrate 100 and the polysilicon layer 107. The SEG layers 120 and 125 have a thickness ranging from 100 to 1000 Å, and preferably, from 250 to 350 Å. Since the SEG layer 120 is formed and thus the predetermined portions of the semiconductor substrate 100 are elevated to the predetermined thickness d, the gate electrode 110 is recessed in the semiconductor substrate 100 by a predetermined depth. Reference numeral 100a denotes an initial surface of the semiconductor substrate 100 shown in dashed lines.

Figure 4B:
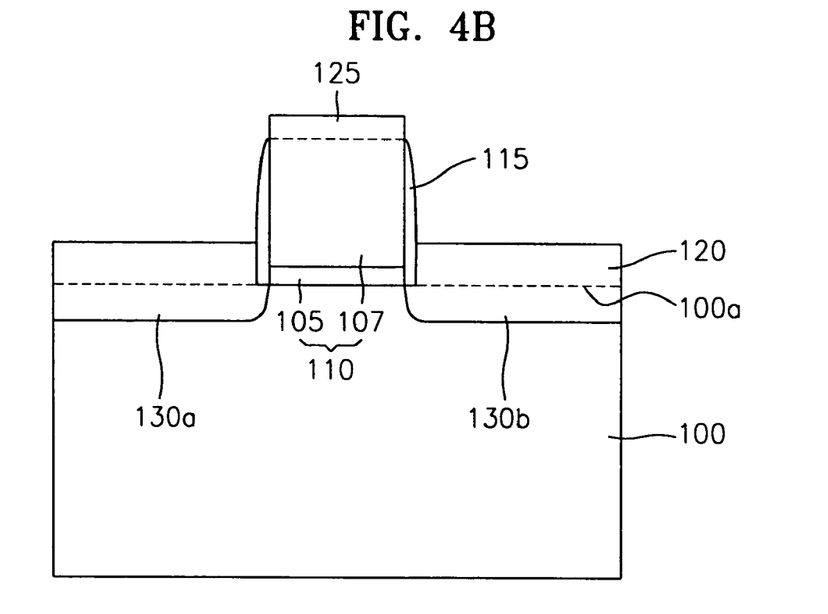

Referring to FIG. 4B, low concentration impurity ions are implanted into the SEG layer 120 and the predetermined portions of the semiconductor substrate 100 under the SEG layer 120 to form the LDD regions 130a and 130b. The low concentration impurity ions are preferably implanted so that the LDD regions 130a and 130b are thicker than the SEG layer 120.

Figure 4C:
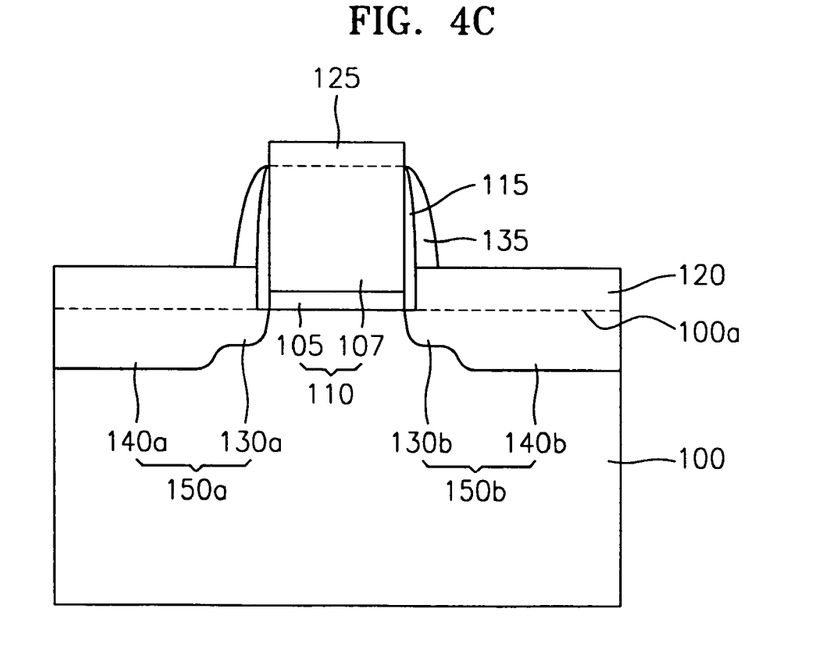

Referring to FIG. 4C, the insulating layer is deposited on the resultant structure, and then anisotropically blanket-etched to form an LDD spacer 135 along the offset spacer 115. The LDD spacer 135 may be a silicon oxide layer or a silicon nitride layer. High concentration impurity ions are implanted into predetermined portions of the semiconductor substrate 100, in which the LDD regions 130a and 130b are formed, beyond the edges of the LDD spacer 135 to form heavily doped regions 140a and 140b. As a consequence, the source region 150a and the drain region 150b are formed. The source region 150a and the drain region 150b have a shallow junction depth of 500 to 800 Å below the initial surface 100a of the semiconductor substrate 100, but have a relatively large junction depth of approximately 800 to 1000 Å below the surface of the SEG layer 120, which is lifted from the surface of the semiconductor substrate 100.

Figure 4D:
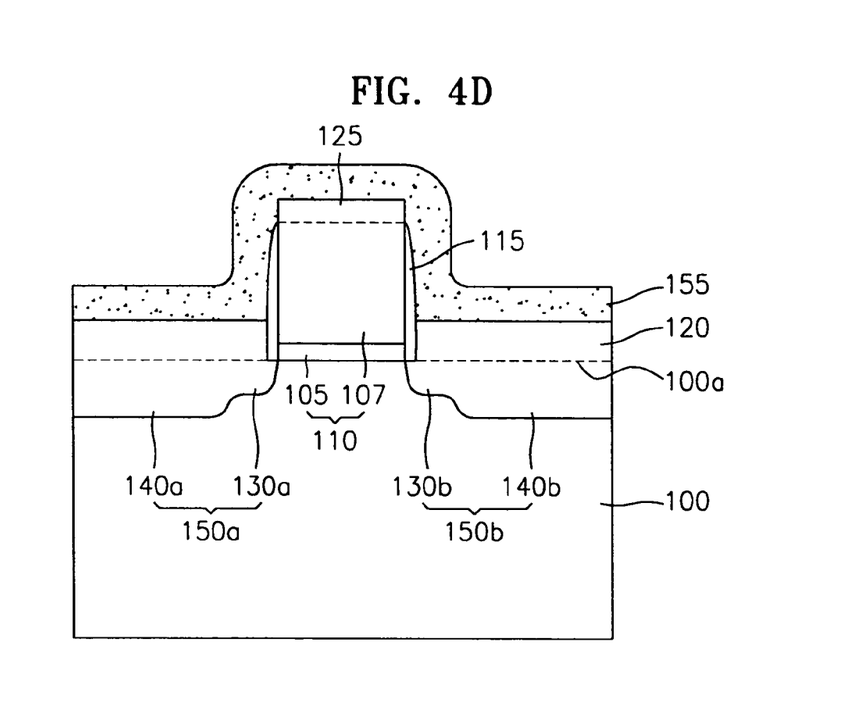

Referring to FIG. 4D, the LDD spacer 135 is removed using a conventional method to expose the LDD regions 130a and 130b. Next, a refractory transition metal layer 155 is formed on the resultant structure. The transition metal layer 155 may be made of a metal selected from the group consisting of titanium (Ti), cobalt (Co), nickel (Ni), platinum (Pt), and a combination of the titanium, cobalt, nickel, and platinum. The transition metal layer 155 has a thickness of 100 to 1000 Å, and preferably, 100 to 200 Å.

Referring to FIG. 3, the resultant structure is thermally processed to form the silicide layer 160 to a thickness of 100 to 1000 Å, and preferably, 100 to 200 Å, on the gate electrode 110, the source region 150a and the drain region 150b. If the transition metal layer is made of titanium or cobalt, the resultant structure of the semiconductor substrate 100 is first thermally processed at a temperature of 350 to 600° C. and then second thermally processed at a temperature of 500 to 900° C. to form the silicide layer of a stable phase. On the other hand, if the transition metal layer is made of nickel, the resultant structure of the semiconductor substrate 100 is thermally processed once at a temperature of 350 to 650° C. to form the silicide layer of a stable phase. Next, unreacted portions of the transition metal layer, that is, portions of the transition metal layer remaining on the offset spacer 115 and a separating layer (not shown) are removed by a wet etching process. Accordingly, the silicide layer 160 is formed on the gate electrode 110, the source region 150a, and the drain region 150b.

Figure 5A:
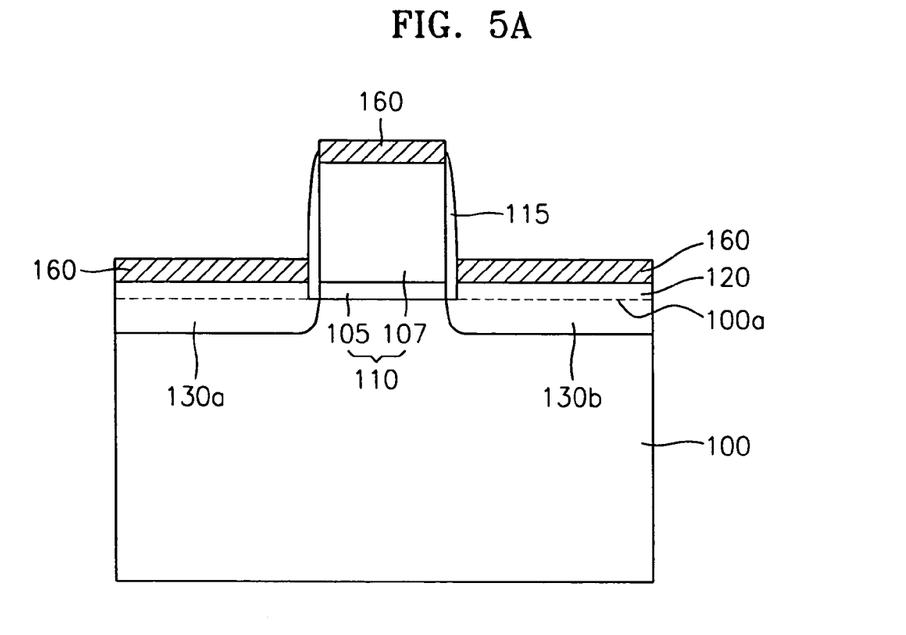
FIGS. 5A and 5B are cross-sectional views for explaining a modified example of the highly integrated semiconductor device of FIG. 3.

The silicide layer 160 can be formed between the forming of the LDD regions 130a and 130b and the forming of the LDD spacer 135. That is, after the LDD regions 130a and 130b are formed as shown in FIG. 4B, the transition metal layer (not shown) is deposited on the semiconductor substrate 100 and then thermally processed to form the silicide layer 160 on the LDD regions 130a and 130b and the gate electrode 110, as shown in FIG. 5A.

Figure 5B:
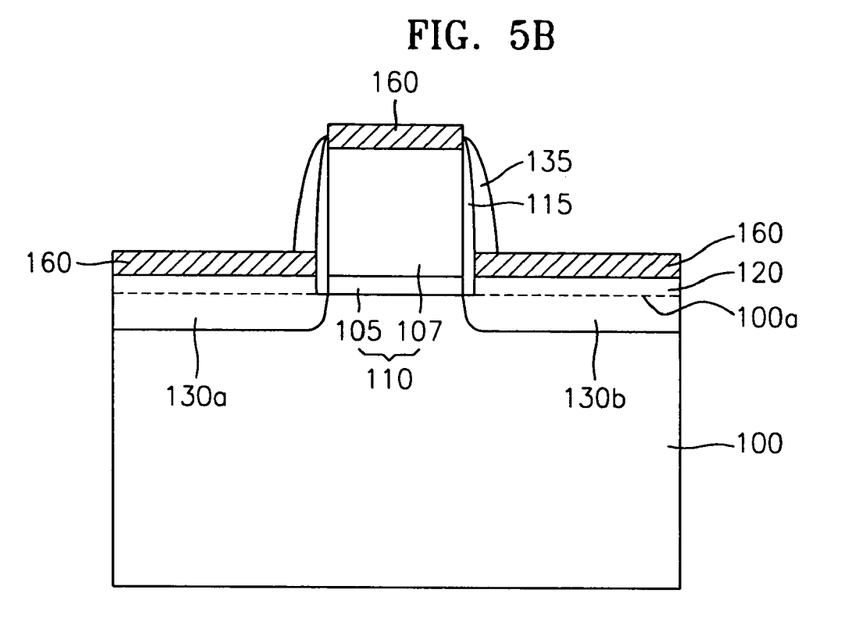

Referring to FIG. 5B, the LDD spacer 135 is formed along the sides of the offset spacer 115 using a conventional method. Next, high concentration impurities are implanted into the LDD regions 130a and 130b on which the silicide layer 160 is formed to form the heavily doped regions 140a and 140b. The LDD spacer 135 is then removed.

Referring to FIG. 3, the interlayer insulating layer 180 is deposited on the resultant structure, and a photoresist pattern (not shown) is formed by a conventional photolithography process on the interlayer insulating layer 180 and exposes the source region 150a and the drain region 150b. Next, the interlayer insulating layer 180 is etched using the photoresist pattern as an etch mask to form the contact hole 185. Next, the photoresist pattern is removed. Since the silicide layer 160, which has a thickness large enough to function as an ohmic contact layer, is also formed on the LDD regions 130a and 130b, a contact area and a contact margin increase, and a contact resistance decreases even if the LDD regions 130a and 130b are exposed due to some misalignment.

According to this embodiment, the silicide layer 160 having the sufficient thickness to serve as the ohmic contact layer is formed on the heavily doped regions 140a and 140b and the LDD regions 130a and 130b. Hence, the contact area extends from the heavily doped regions 140a and 140b to the LDD regions 130a and 130b, thereby securing a sufficient contact margin.

Further, since the silicide layer 160 having a low resistance is formed on the LDD regions 130a and 130b having a relatively low impurity concentration, a sheet resistance of the LDD regions 130a and 130b is reduced. Consequently, a parasitic resistance decreases and the performance of the semiconductor device is enhanced.

Furthermore, since the source region 150a and the drain region 150b are formed in the SEG layer 120, which is elevated from the semiconductor substrate 100, a sufficient junction depth is ensured. Since a sufficient amount of silicon is provided during the forming of the silicide layer while securing the source region 150a and the drain region 150b, a junction leakage current is reduced.

Figure 6:
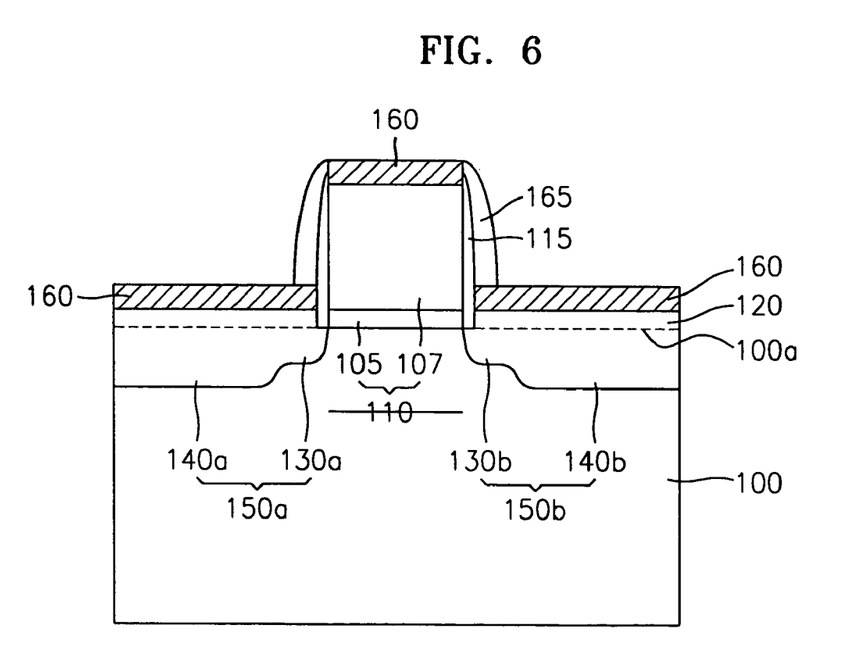
FIG. 6 is a cross-sectional view of a highly integrated semiconductor device according to a second preferred embodiment of the present invention.

FIG. 6 is a cross-sectional view of a highly integrated semiconductor device according to a second embodiment of the present invention.

In the same manner as described in the first embodiment, the silicide layer 160 is formed on the gate electrode 110, the source region 150a, and the drain region 150b. Next, a self-aligned spacer 165 is formed along the sidewalls of the offset spacer 115 that is formed along the sidewalls of the gate electrode 110. The self-aligned spacer 165 may be a silicon nitride layer, and may be thicker than the offset spacer 115.

Since a self-aligned contact (SAC) pad (not shown) can be formed on the source region 150a and the drain region 150b on the sides of the gate electrode 110 by virtue of the self-aligned spacer 165, the highly integrated semiconductor device according to the second embodiment of the present invention can be used as a transistor in a dynamic random access memory (DRAM) cell.

Figure 7:
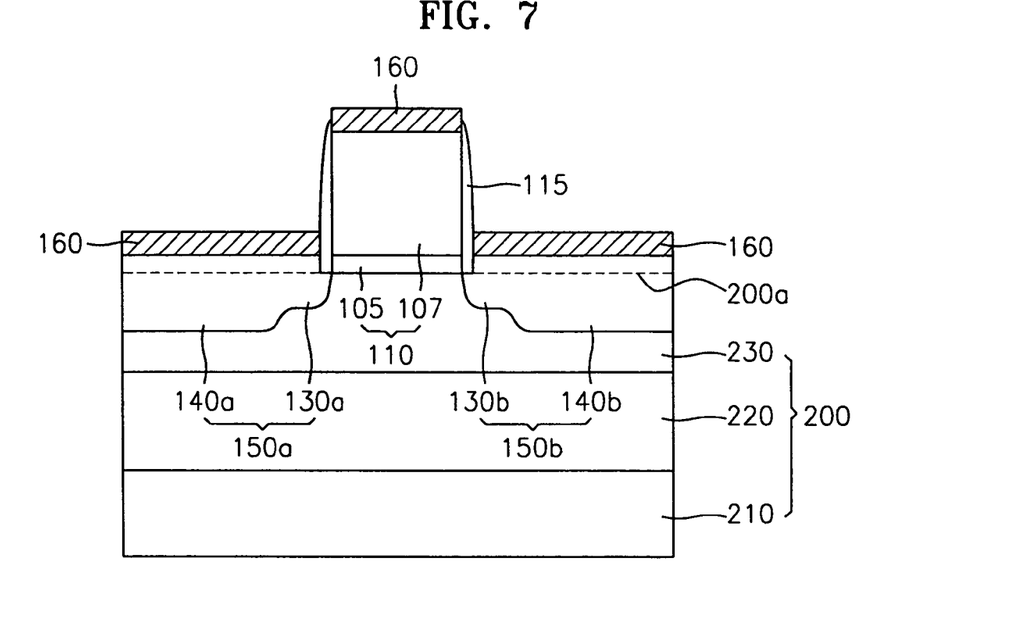
FIG. 7 is a cross-sectional view of a highly integrated semiconductor device according to a third preferred embodiment of the present invention.

FIG. 7 is a cross-sectional view of a highly integrated semiconductor device according to a third embodiment of the present invention.

The highly integrated semiconductor device can be formed on a silicon-on-insulator (SOI) substrate instead of the semiconductor substrate 100 made of silicon. Referring to FIG. 7, an SOI substrate 200 is prepared. The SOI substrate 200 includes a base substrate 210, a silicon oxide film-buried layer 220, and a silicon layer. 230. The SOI substrate 200 can be formed by bonding two wafers or implanting oxygen into a wafer using ion implantation.

Next, the gate electrode 110 and the source and drain regions 150a and 150b are sequentially formed in the SOI substrate 200 in the same manner as described in the first embodiment of the present invention. Since the silicon layer 230 of the SOI substrate 200 has the same properties as the semiconductor substrate 100 of the first embodiment of the present invention, the highly integrated semiconductor device can be manufactured through the same processes as described in the first embodiment of the present invention.

According to the third embodiment of the present invention, the bottom surfaces of the source region 150a and the drain region 150b are separated from the silicon oxide film-buried layer 220 by a predetermined distance. However, the bottom surface of the source region 150a and the drain region 150b may be in contact with the silicon oxide film-buried layer 220, respectively.

The highly integrated semiconductor device of the third embodiment can obtain the same effect as that of the previous embodiments and further reduces latch-up caused by parasitic resistance.

Figure 8:
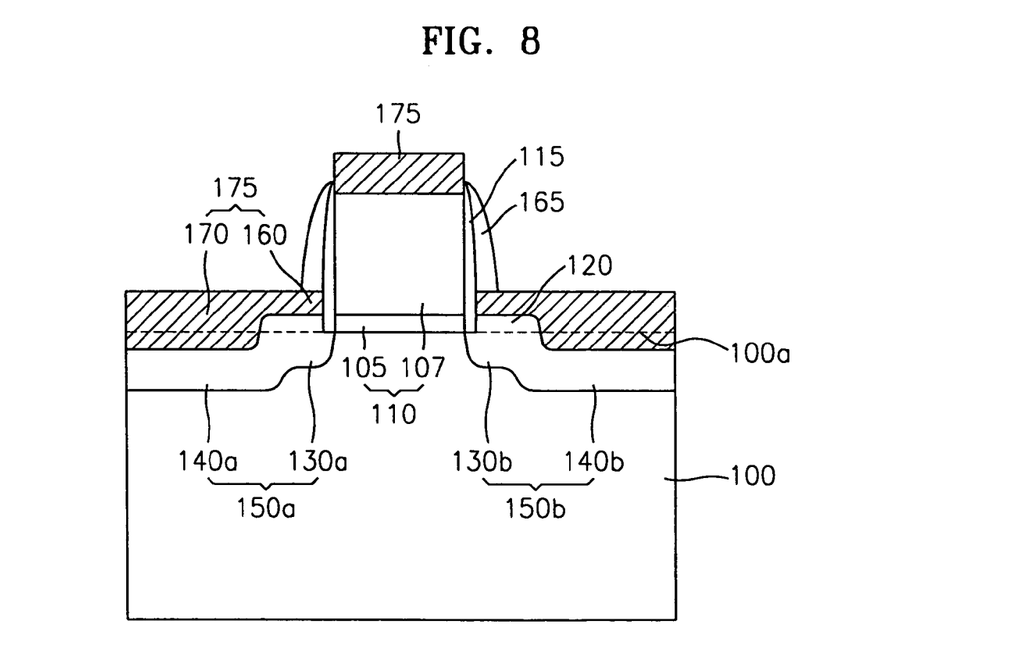
FIG. 8 is a cross-sectional view of a highly integrated semiconductor device according to a fourth preferred embodiment of the present invention.

FIG. 8 is a cross-sectional view of a highly integrated semiconductor device according to a fourth embodiment of the present invention.

To reduce the resistance of the source region 150a and the drain region 150b, a second silicide layer 170 is formed on a predetermined portion of the source region 150a and the drain region 150b.

That is, after the self-aligned spacer 165 is formed along the sidewalls of the offset spacer 115, which is formed along the sidewalls of the gate electrode 110 in the same manner as described in the second embodiment, a second transition metal layer (not shown) is formed on the resultant structure of the highly integrated semiconductor. The second transition metal layer may be the same as or different from the first transition metal layer. For example, the second transition metal layer may be made of titanium, cobalt, nickel, or platinum. Next, the portion of the semiconductor substrate 100 on which the second transition metal layer is formed is thermally processed at a predetermined temperature to form the second silicide layer 170. Here, the thermal processing step can be performed once or twice depending on a metal of the transition metal layer, similarly to the first embodiment of the present invention.

The second silicide layer 170 is formed on the gate electrode 110 and the heavily doped regions 140a and 140b of the source region 150a and the drain region 150b, which are exposed by the self-aligned spacer 165. Because of the second silicide layer 170, a total silicide layer 175 including the first silicide layer 160 and the second silicide layer 170 formed on the gate electrode 110 is thicker than the first silicide layer 160, and the total silicide layer 175 formed on the source region 150a and the drain region 150b has a stepped shape.

Since the second silicide layer 170 is further formed on the gate electrode 110, the source region 150a, and the drain region 150b, the resistance of the gate electrode 110, the source region 150a, and the drain region 150b is further reduced.

As described above, the silicide layer having the sufficient thickness to function as the ohmic contact layer is uniformly formed on the LDD regions. Accordingly, even if the LDD regions are exposed due to misalignment resulting from the forming of the contact hole, a contact resistance is not increased. In addition, since the LDD regions can be used as a contact area, a sufficient contact margin of the highly integrated semiconductor device is secured.

Moreover, since the silicide layer having the predetermined thickness is formed on the LDD regions having the relatively low concentration, the resistance of the LDD regions is reduced and a parasitic resistance is prevented from increasing.

Since the source region and the drain region are formed in the SEG layer, which is lifted from the substrate, a sufficient junction depth is obtained. Consequently, a sufficient amount of silicon can be provided during the forming of the slilicide layer while securing the source region and the drain region of the predetermined depth, thereby reducing a junction leakage current.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A highly integrated semiconductor device comprising:
   a semiconductor substrate;
   a gate electrode disposed on a predetermined portion of the semiconductor substrate;
   an epitaxial layer formed on the semiconductor substrate on both sides of the gate electrode to overlap the gate electrode to a predetermined depth;
   a source region and a drain region formed in the epitaxial layer and predetermined upper portions of the semiconductor substrate below the epitaxial layer, wherein each of the source region and the drain region includes a lightly doped drain region adjacent to the sidewalls of the gate electrode and a heavily doped region formed beside the lightly doped drain region;
   an offset spacer formed between the sidewalls of the gate electrode and the lightly doped drain region to insulate the gate electrode from the source region and the drain region; and
   a silicide layer formed on the gate electrode, the source region, and the drain region,
   wherein the silicide layer is in contact with the lightly doped drain region and the heavily doped region of each of the source region and the drain region.

2. The highly integrated semiconductor device of claim 1, wherein the epitaxial layer is at least one of a silicon layer and a silicon-germanium layer.

3. The highly integrated semiconductor device of claim 1, wherein the epitaxial layer has a thickness ranging approximately from 250 to 350 Å.

4. The highly integrated semiconductor device of claim 3, wherein each of the source region and the drain region has a depth ranging from 800 to 1000 Å.

5. The highly integrated semiconductor device of claim 1, wherein the offset spacer has a minimum thickness necessary to insulate conductive layers from each other.

6. The highly integrated semiconductor device of claim 5, wherein the offset spacer has a thickness ranging from 150 to 250 Å.

7. The highly integrated semiconductor device of claim 1, wherein the silicide layer is thinner than the epitaxial layer.

8. The highly integrated semiconductor device of claim 1, wherein the silicide layer is composed of a metal selected from the group consisting of titanium, cobalt, nickel, platinum, and a combination of these metals.

9. The highly integrated semiconductor device of claim 1, wherein the semiconductor substrate is a silicon-on-insulator substrate.

10. The highly integrated semiconductor device of claim 1, further comprising a self-aligned spacer, which is formed along sidewalls of the offset spacer.

* * * * *